（12） United States Patent
Chen

(10) Patent No.: US 7,345,861 B2
(45) Date of Patent: Mar. 18, 2008

(54) CAPACITOR CIRCUIT WITH SURGE PROTECTION

(75) Inventor: Keming Chen, Torrance, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 232 days.

(21) Appl. No.: 11/209,559

(22) Filed: Aug. 23, 2005

(65) Prior Publication Data

US 2007/0047171 A1    Mar. 1, 2007

(51) Int. Cl.
*H02H 9/00*    (2006.01)
(52) U.S. Cl. .............................. 361/56; 361/58; 361/91; 361/93.1; 361/118; 361/119; 361/321.1
(58) Field of Classification Search ............ 361/56–58, 361/91, 93.1, 18, 118–119, 321.1, 306.2
See application file for complete search history.

(56) References Cited

U.S. PATENT DOCUMENTS

| 5,079,455 | A | * | 1/1992 | McCafferty et al. | ........ 327/318 |
| 5,532,894 | A | * | 7/1996 | Sweaton | ........ 361/18 |
| 5,598,313 | A | * | 1/1997 | Gersbach | ........ 361/56 |
| 5,621,625 | A | * | 4/1997 | Bang | ........ 363/21.1 |
| 5,796,567 | A | * | 8/1998 | Botti et al. | ........ 361/91.2 |
| 6,768,619 | B2 | * | 7/2004 | Ker et al. | ........ 361/56 |
| 6,927,954 | B2 | * | 8/2005 | Boudreaux et al. | ........ 361/42 |

* cited by examiner

*Primary Examiner*—Nguyen T. Ha

(57) ABSTRACT

A capacitor circuit with surge protection that is selectively connected between a voltage source and a device includes a first capacitance element has one end that communicates with a first terminal of the voltage source. A first transistor has a first terminal that communicates with an opposite end of the first capacitance element and a second terminal that communicates with a second terminal of the voltage source. A control terminal of the first transistor communicates with a capacitor enable signal that provides a controlled turn-on to limit current surge and turns off the first transistor when voltage surge is detected.

19 Claims, 2 Drawing Sheets

US 7,345,861 B2

CAPACITOR CIRCUIT WITH SURGE PROTECTION

FIELD OF THE INVENTION

The present invention relates to current and voltage surge protection circuits.

BACKGROUND OF THE INVENTION

Capacitors are typically connected between a voltage source and other devices. Referring to FIG. 1, a voltage source 10 is connected in parallel with a capacitor 11 and a device 14. The capacitor 11 may be a film capacitor that provides a filtering effect and may be used to reduce ripple current.

For example, the capacitor may be used between a voltage source such as a battery of a vehicle and a DC-DC converter. When the first time the DC-DC converter with the capacitor is connected to the battery surge currents may occur that can damage the capacitor. In vehicle applications, high surge voltage may occur which exclude the use of capacitors with low voltage surge capability.

While film capacitors have been used in higher surge voltage and current applications, they have very large size and much higher cost than other type of capacitors. In vehicle applications such as fuel cells and hybrids vehicles where size and cost are very important, film capacitors are not desirable.

SUMMARY OF THE INVENTION

A capacitor circuit with surge protection that is selectively connected or disconnected between a voltage source and a device comprises a first capacitance element has one end that communicates with a first terminal of the voltage source. A first transistor has a control terminal that communicates with an enable signal from the device, a first terminal that communicates with an opposite end of the first capacitance element and a second terminal that communicates with a second terminal of the voltage source.

In other features, a second transistor has a first terminal that communicates with the control terminal of the first transistor and a second terminal that communicates with the second terminal of the voltage source. A Zener diode has an anode that communicates with a control terminal of the second transistor. A first resistor has one end that communicated with the first terminal of the voltage source and an opposite end that communicates with the cathode of the Zener diode.

In other features, a second capacitance element has one end that communicates with the opposite ends of the first capacitance element and an opposite end that communicates with the control terminal of the first transistor. A second resistor has one end that communicates with the control terminal of the first transistor and an opposite end that communicates with an enable signal generated by the device.

A system comprises the capacitor circuit and further comprising a device that selectively generates an enable signal for the control terminal of the first transistor. The device includes a DC/DC converter.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
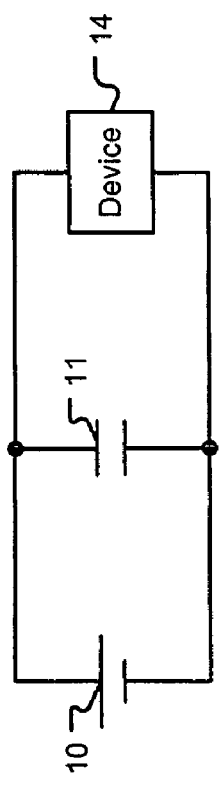
FIG. 1 is a schematic of a film capacitor circuit according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 2:
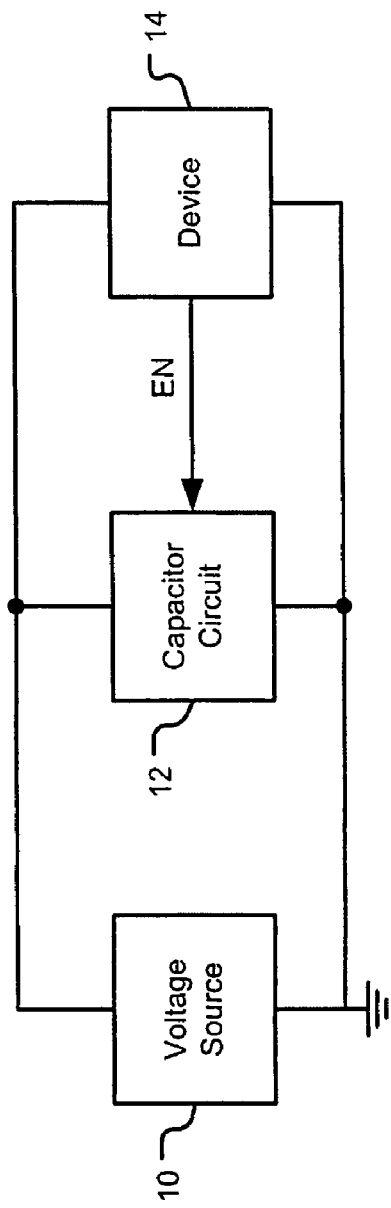
FIG. 2 is a functional block diagram of a voltage limiting control system according to the present invention.

Referring now to FIG. 2, a capacitor circuit 12 with surge protection is connected to a voltage source 10 and a device 14. In some implementations, the device 14 is a DC-DC converter, although the capacitor circuit 12 can be used with other types of devices 14. The capacitor circuit 12 limits current surge through a controlled turn on when connected to the voltage source as will be described below. The capacitor circuit 12 also limits voltage surge as will be described below.

Figure 3:
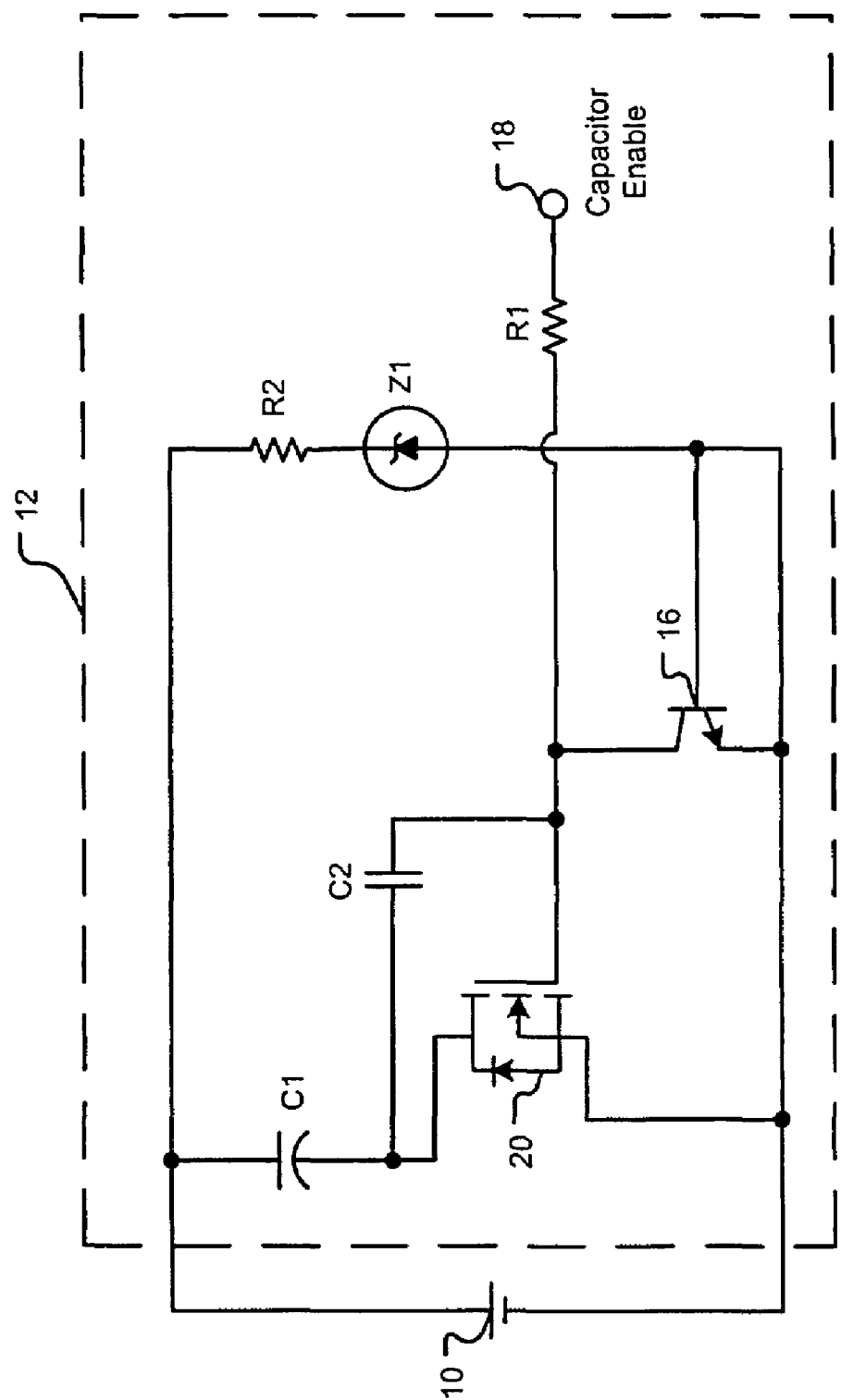
FIG. 3 is a schematic of the capacitor surge protection circuit of FIG. 2.

Referring now to FIG. 3, the capacitor circuit 12 with voltage and current surge protection is illustrated in further detail. A positive side of the voltage source 10 is connected to one end of capacitor C1. A first transistor 20 has a first terminal communicates with the opposite end of capacitor C1. A second terminal of the transistor 20 is connected to the negative side of the voltage source 10. A control terminal of the transistor 20 communicates with a capacitor enable signal 18 that provides a controlled turn-on to limit current surge and turns off the transistor 20 when voltage surge is detected.

In some embodiments, a second capacitor C2 has one end that connects to the opposite end of capacitor C1 and the opposite end of C2 is connected to the control terminal of the transistor 20. A first resistor has one end that connects to the control terminal of the transistor 20 and an opposite end that connects to the capacitor enable signal 18. The capacitor C2 and the resistor R1 are selected to control voltage change or $$\frac{dv}{dt}$$

across the first and second terminals of the transistor 20.

In some embodiments, the transistor 20 is a MOSFET. The capacitor enable signal 18 controllably turns on the transistor 20, which limits current surge in the capacitor C1 during turn-on.

In some embodiments, a second transistor 16 has a first terminal that connects to the control terminal of the transistor 20. A second terminal of transistor 16 is connected to the second terminal of transistor 20. An anode of a zener diode Z1 is connected to a control terminal of transistor 16. A second resistor R2 has a one end that connects to the cathode of the zener diode Z1 and an opposite end of resistor R2 is connected to the positive side of the voltage source 10. Transistor 16, zener diode Z1 and resistor R2 forms a surge voltage detecting circuit that turns off the transistor 20 when surge voltage occurs across the capacitor C1.

In some embodiments, the second transistor 16 is a bipolar transistor such as a npn transistor. The control terminal is a base, the first terminal is a collector, and the second terminal is an emitter.

The capacitor circuit 12 with surge protection has four modes: (1) disabled, (2) controlled turn-on to limit current surge, (3) when the voltage is less than the breakdown voltage of the zener diode, and (4) when the voltage is greater than the breakdown voltage of the zener diode.

In the disabled mode, the capacitor enable output 18 is low, which turns transistor 20 off and capacitor C1 is effectively open circuits.

During controlled turn-on, the capacitor enable output 18 transitions from low to high in a controlled manner to controllably turn on transistor 20 and to limit current surge through the capacitor C1.

The next mode occurs when the voltage is less than the breakdown voltage of the zener diode Z1 and the capacitor enable output 18 is high. The transistor 20 is on. The zener diode Z1 is reverse biased. As a result, the first transistor 16 is off. The capacitor C1 is connected across the voltage source 10.

The final mode occurs when the voltage is greater than the breakdown voltage of the zener diode Z1. The capacitor enable output 18 is still high. The zener diode Z1 exceeds its breakdown voltage and turns on the transistor 16. The transistor 16 conducts and turns off the transistor 20. The capacitor C1 is disconnected from the voltage source 10.

In one implementation, exemplary circuit values are C1=100 µF, C2=1 nF, R1=1 kΩ, and R2=1 kΩ. C1 is rated at 20V, the zener diode Z1 is rated at 18V, and the transistor 20 is rated at 30V.

The capacitor circuit 12 with surge protection increases the reliability of the capacitors by limiting current and voltage surge. Furthermore, the capacitors can be turned off when not in use. Prior to turning on the DC-DC converter or other device, the capacitors can be turned on.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A capacitor circuit with surge protection that is selectively connected between a voltage source and a device, comprising:
   a first capacitance element having one end that communicates with a first terminal of the said voltage source;
   a first transistor having a first terminal that communicates with an opposite end of said first capacitance element, a second terminal that communicates with a second terminal of the said voltage source and a control terminal that communicates with the said device that selectively generates an enable signal; and
   a second transistor that communicates with said first transistor,
   wherein said second terminal is in selective communication with said control terminal based on state of said second transistor.

2. The capacitor circuit of claim 1 further comprising a second capacitance element having one end that communicates with said opposite ends of said first capacitance element and an opposite end that communicates with said control terminal of said first transistor.

3. The capacitor circuit of claim 2 further comprising a first resistance element having one end that communicates with said control terminal of said first transistor and an opposite end that communicates with said device.

4. The capacitor circuit of claim 3 further comprising:
   a Zener diode having an anode that communicates with a control terminal of said second transistor; and
   a second resistance element having a one end that communicates with said cathode of said Zener diode and an opposite end that communicates with said first terminal of said voltage source.

5. The system of claim 1 wherein said device provides a controlled turn-on for the said first capacitance element to limit current surge and turns off the said first transistor when voltage surge is detected.

6. The system of claim 5 wherein said device includes a power converter.

7. The system of claim 1 wherein said enable signal is feedback from the device.

8. The system of claim 1 wherein said opposite end of said first capacitance element is directly coupled to said first terminal.

9. The system of claim 8 wherein said opposite end of said first capacitance element is indirectly coupled to said control terminal.

10. The system of claim 9 further comprising a second capacitance element coupled between said first capacitance element and said control terminal.

11. The system of claim 9 further comprising a second capacitance element directly coupled to said first capacitance element and said control terminal.

12. The system of claim 1 wherein said second transistor element is coupled between said second terminal and said control terminal.

13. The system of claim 1 wherein said second transistor is directly coupled between said second terminal and said control terminal.

14. The system of claim 1 further comprising a resistance element having one end that communicates with said control terminal of said first transistor and an opposite end that communicates with said device,
   wherein said opposite end of said resistance element is disconnected from said first and second terminals.

15. The system of claim 1 further comprising a resistance element having one end that communicates with said control terminal of said first transistor and an opposite end that communicates with said device,
   wherein said opposite end of said resistance element receives said enable signal from a power converter.

16. The system of claim 1 further comprising a resistance element having one end that communicates with said control terminal of said first transistor and an opposite end that communicates with said device,
   wherein said opposite end of said resistance element is disconnected from said first terminal of said first transistor.

17. The system of claim 1 further comprising a resistance element having one end that communicates with said control terminal of said first transistor and an opposite end that communicates with said device,
   wherein said opposite end of said resistance element is disconnected from said opposite end of said first capacitance.

18. A capacitor circuit with surge protection that is selectively connected between a voltage source and a device, comprising:
- a first capacitance element having one end that communicates with a first terminal of the said voltage source;
- a first transistor having a first terminal that communicates with an opposite end of said first capacitance element, a second terminal that communicates with a second terminal of the said voltage source and a control terminal that communicates with the said device that selectively generates an enable signal;
- a second transistor having a first terminal that communicates with said control terminal of said first transistor;
- a Zener diode having an anode that communicates with said control terminal of said second transistor; and
- a second resistance element having a one end that communicates with said cathode of said Zener diode and an opposite end that communicates with said first terminal of said voltage source.

19. A capacitor circuit with surge protection that is selectively connected between a voltage source and a device, comprising:
- a first capacitance element having one end that communicates with a first terminal of the said voltage source; and
- a first transistor having a first terminal that communicates with an opposite end of said first capacitance element, a second terminal that communicates with a second terminal of the said voltage source and a control terminal that communicates with the said device that selectively generates an enable signal,
- wherein said device provides a controlled turn-on for the said first capacitance element to limit current surge and turns off the said first transistor when voltage surge is detected.

* * * * *